(12) United States Patent
Nguyen

(10) Patent No.: US 7,221,216 B2
(45) Date of Patent: May 22, 2007

(54) SELF-OSCILLATING SWITCHING AMPLIFIER

(75) Inventor: Tranh T. Nguyen, Rohnert Park, CA (US)

(73) Assignee: NPhysics, Inc., San Jose, CA (US)

( * ) Notice: Subject to any disclaimer, the term of this patent is extended or adjusted under 35 U.S.C. 154(b) by 20 days.

(21) Appl. No.: 11/132,810

(22) Filed: May 18, 2005

(65) Prior Publication Data
US 2006/0006933 A1    Jan. 12, 2006

Related U.S. Application Data

(60) Provisional application No. 60/618,869, filed on Oct. 13, 2004, provisional application No. 60/572,548, filed on May 18, 2004.

(51) Int. Cl.
H03F 3/38      (2006.01)
H03F 3/217     (2006.01)

(52) U.S. Cl. .......................... 330/10; 330/251
(58) Field of Classification Search .................. 330/10, 330/207 A, 251
See application file for complete search history.

(56) References Cited

U.S. PATENT DOCUMENTS

| 6,707,337 B2 * | 3/2004 | Noro ........................ 330/10 |
| 6,753,729 B2 * | 6/2004 | Broadley ................ 330/207 A |
| 2002/0033734 A1 | 3/2002 | Broadley |

* cited by examiner

*Primary Examiner*—Steve J. Mottola
(74) *Attorney, Agent, or Firm*—Kokka & Hsu, PC

(57) ABSTRACT

A self-oscillating switching amplifier having an error amplifier output combined with the output of an output signal differentiator according predetermined weighing factors to force a small oscillation around the averaged output signal at a high frequency. The feedback voltage is sensed at the output of the switching amplifier. Additional feedback can be derived from a switching node of the power switch. The switching of the power switch can be dynamically changed from binary switching when the amplitude of the audio signal is low, to ternary switching when the amplitude of the input signal is high to minimize distortion of the output signal. The amplifier can be supplied with a pulsing voltage. In certain embodiments the output signal differentiator is simply a capacitor or a LC resonance circuit coupled directly to an appropriate speaker terminal for the highest possible self-oscillating frequency of the switching amplifier.

15 Claims, 14 Drawing Sheets

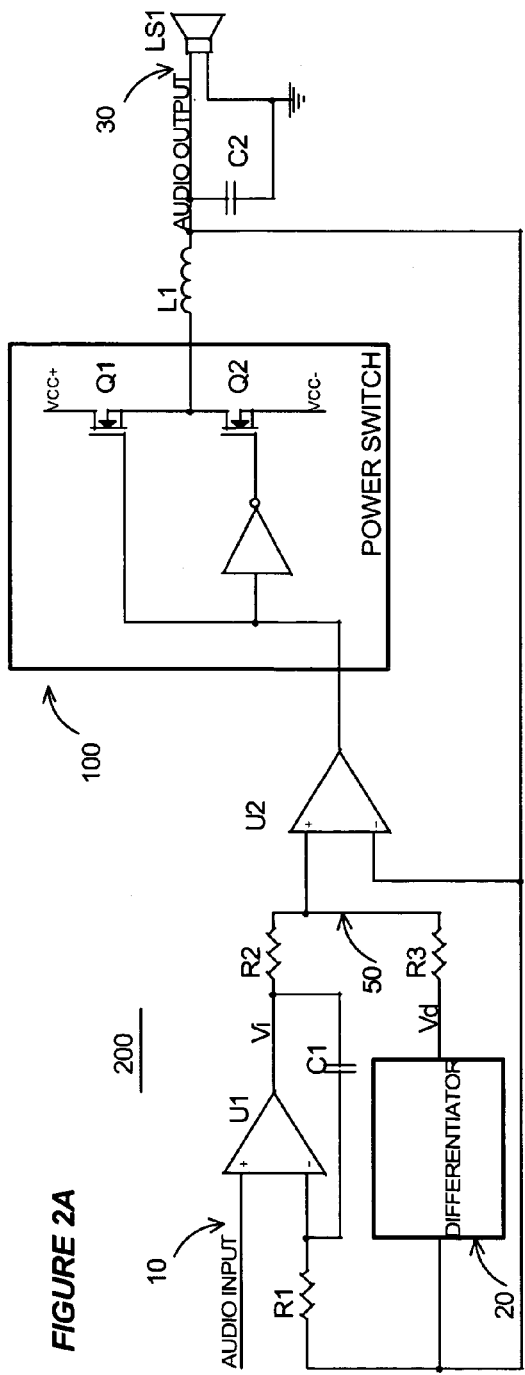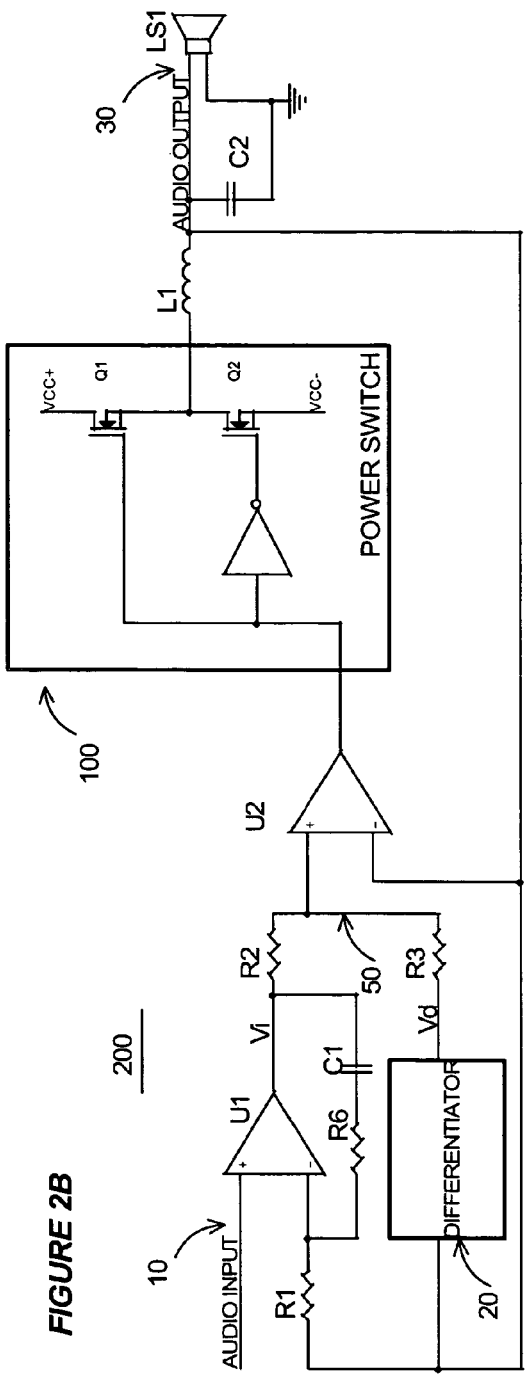

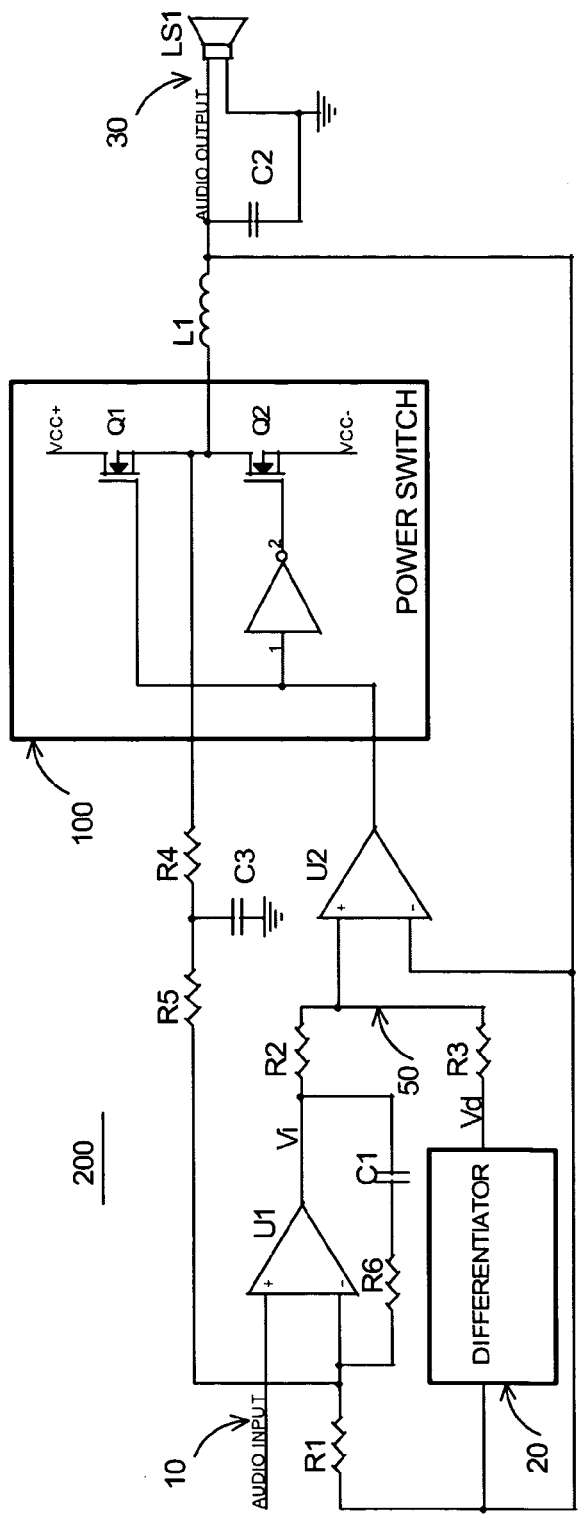
*FIGURE 3*
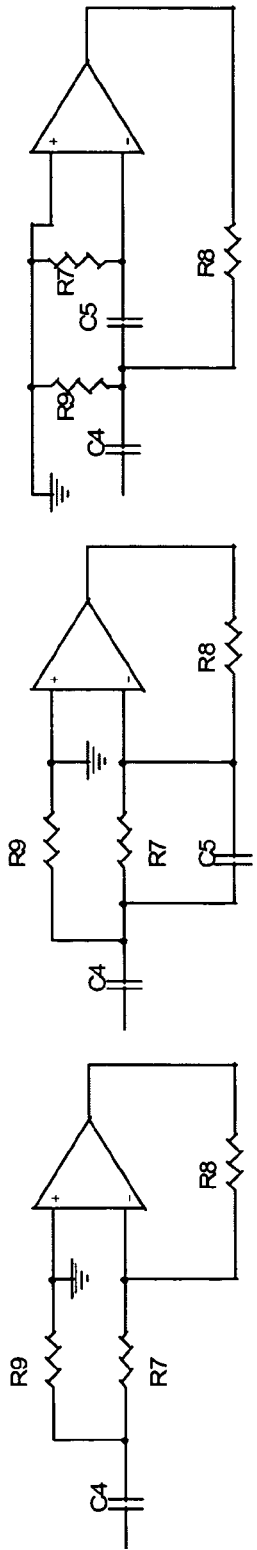
*FIGURE 6A*
*FIGURE 6B*
*FIGURE 6C*

SELF-OSCILLATING SWITCHING AMPLIFIER

CROSS-REFERENCE TO RELATED APPLICATIONS

This application claims the benefit of priority to U.S. Provisional Application No. 60/572,548 filed May 18, 2004, and to U.S. Provisional Application No. 60/618,869, filed Oct. 13, 2004, both of which applications are fully incorporated herein by reference and for all purposes.

BACKGROUND OF THE INVENTION

1. Field of the Invention

The present invention relates generally to amplifiers, and specifically to switching amplifiers.

2. Description of Related Art

Switching amplifiers typically generate a pulse-width modulated (PWM) waveform by comparing a triangular oscillator's waveform to the audio input signal. The linearity of the triangular waveform has a direct effect on the distortion of the audio output. Many other elements of a switching amplifier such as fluctuation of power supply voltages, switching delays, dead times, nonlinearities of most semiconductor components and real passive components, all contribute to relatively high distortion of switching amplifiers.

Reduction in distortion is normally accomplished with negative feedback. In a switching amplifier there is normally a reconstruction filter to minimize EMI at the amplifier output. The low-pass nature of the reconstruction filter introduces a phase shift that quickly approaches and exceeds 180 degrees. That large phase shift makes the design of the feedback loop difficult due to the possibility of oscillation when the total phase loop shift exceeds 360 degrees, taking into account the inherent 180 degrees phase shift of the negative feedback path and the error amplifier's own phase shift which reaches 90 degrees at only tens of hertz. Very often the feedback signal is picked up from a switching node of the power switch, before the reconstruction filter, therefore not including the reconstruction filter, to circumvent the 180-degree phase shift of the reconstruction filter. A reconstruction filter typically uses an inductor and a capacitor. These devices have their own non-linearities especially when an iron or ferrite core is used in the inductor. Magnetic hysteresis is naturally non-linear, and can be a major cause of distortion of switching amplifiers.

The need for stable feedback loop thus limits the bandwidth of typical switching amplifiers. Some switching amplifiers that process signals only in the digital domain don't even have any feedback and suffer from distortions. Limited bandwidth of conventional feedback for switching amplifiers thus limits their audio performance in terms of distortion. Even all linear amplifiers designed with global feedback by necessity have a dominant pole to assure loop stability. That dominant pole in turn limits the bandwidth of linear amplifiers, and more importantly reduces their ability to attenuate distortion at high frequencies where human ears can really tell slight differences. Indeed studies have shown that high-order harmonic distortions are not pleasing to our ears whereas low order harmonics can be tolerated because they already exist in the audio program and because they are in fact harmonious with the fundamental. Tube amplifiers are often liked for their high second and third order harmonic distortions while their higher order harmonic distortions are often much smaller due to their class-A type of operation.

Prior art of self-oscillating switching amplifiers such as U.S. Pat. No. 6,707,337 senses mainly switching nodes and integrates their voltages to generate ramps that eventually force comparators to change state. Again the oscillator loop does not include the reconstruction filter therefore their audio performance may be left to be desired. Furthermore it requires both the audio signal and its inverted signal to operate. The signal inverter itself is a source of phase shift and distortion.

Thus there is a need for switching amplifier circuits capable of linear transfer function, high loop gain and bandwidth.

BRIEF SUMMARY OF THE INVENTION

The present invention provides a simple circuit for generating oscillation and for controlling the power switch of switching amplifiers in pulse width modulation (PWM) to achieve high audio performance. Oscillation is generated by forcing the loop phase shift to exceed 360 degrees while loop gain approaches unity. High audio performance is achieved by multiple feedbacks, with at least one of them covers the output reconstruction filter which may have its non-linearities. High frequency switching is accomplished via high speed circuits not only in the high gain section of the loop but also in the feedback circuit. Both high speed operational amplifiers and comparators are used to make switching frequency very high, in the 100–1000 Khz range and above, in spites of the low pass reconstruction filter used by necessity at the output section.

Embodiments of the invention provide, for example, methods and apparatus for controlling a power switch by PWM to provide high audio performance via high frequency self-oscillation. Certain embodiments can also provide methods and apparatus for minimizing distortion of a self-oscillating switching amplifier via multiple feedback paths. Further, certain embodiments provide methods and apparatus for controlling a power switch such that distortion of a self-oscillating switching amplifier is minimized by dynamic change of mode of switching of the power switch.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein:

FIG. 2A–2B are schematic diagrams illustrating an example of a self-oscillating switching amplifier of the present invention.

FIG. 3 is a schematic diagram illustrating additional feedback from a switching node of an example of a self-oscillating amplifier of the present invention.

FIGS. 6A–6C illustrate embodiments for a differentiator used in an example of the present invention.

DETAILED DESCRIPTION OF THE INVENTION

Figure 1:
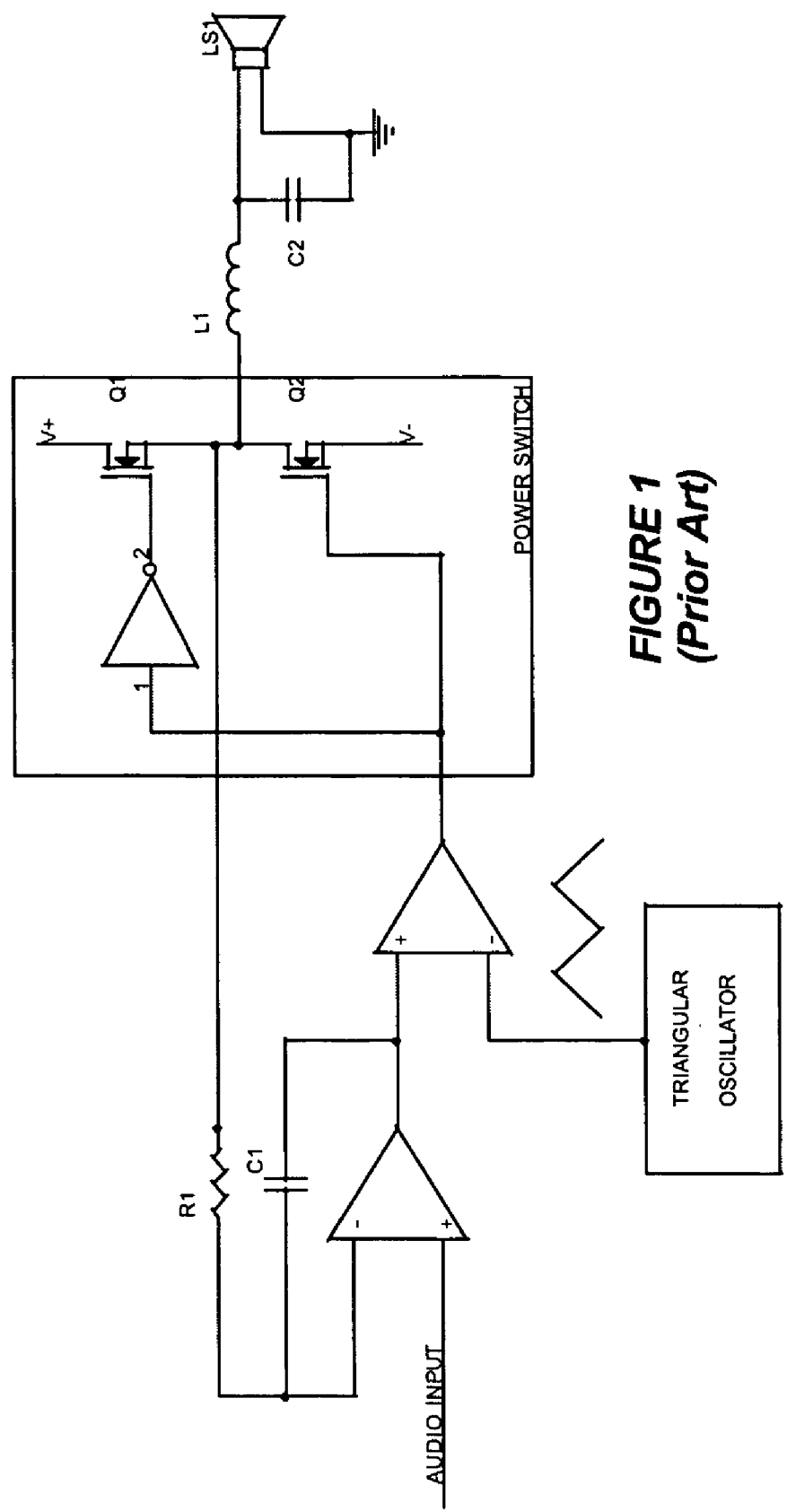
FIG. 1 is a schematic diagram illustrating a prior art switching amplifier.
Figure 4:
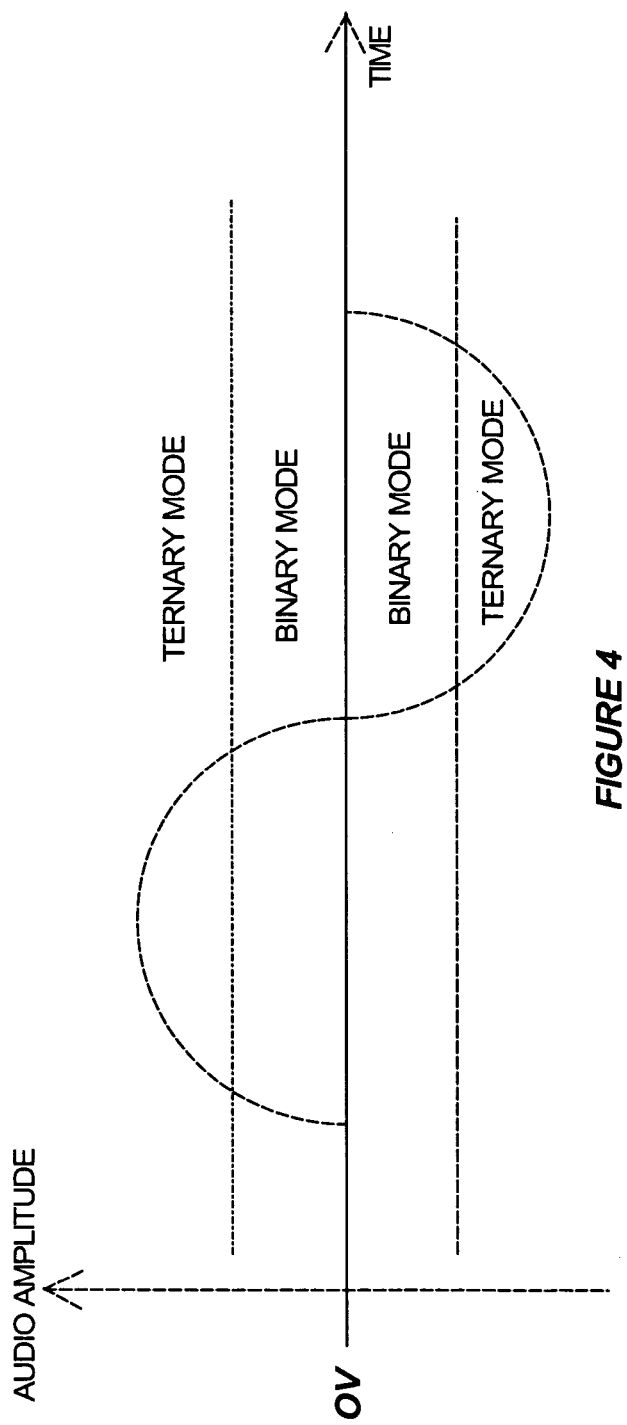
FIG. 4 illustrates a change from binary switching to ternary switching according to the amplitude of the audio input signal.

Embodiments of the present invention will now be described in detail with reference to the drawings, which are provided as illustrative examples so as to enable those skilled in the art to practice the invention. Notably, the figures and examples below are not meant to limit the scope of the present invention. Where certain elements of these embodiments can be partially or fully implemented using known components, only those portions of such known components that are necessary for an understanding of the present invention will be described, and detailed descriptions of other portions of such known components will be omitted so as not to obscure the invention. Further, the present invention encompasses present and future known equivalents to the components referred to herein by way of illustration.

Certain embodiments of the present invention provide a self-oscillating switching amplifier comprising a power switch 100 usually composed of power MOSFETs in a half-bridge or a H-bridge configuration controlled by an analog circuit 200 that operates in a hysteretic mode by sensing the speaker LS1 voltage. The analog control circuit 200 can include an operational amplifier U1 for amplifying and integrating the difference between the audio output signal 30 and the audio input signal 10. An output signal differentiator 20 with its output inverted and amplified by an inverting operational amplifier typically supplies high frequency gain and phase shift that results in natural oscillation at low amplitude of the closed loop which includes an output reconstruction filter L1-C2. This arrangement can be used to force the amplifier loop into high frequency oscillation for superior audio performance. Typically, the output signal 30 or a signal representative of the output signal 30 is provided as an input to the differentiator 20. Output Vi of the error amplifier U1 and output Vd of the output differentiator 20 are typically summed with predetermined complex-number coefficients via values of weighing resistors or impedances R2–R3 into a sum voltage 50, to which a voltage proportional to the output signal 30 can be compared by a comparator U2, such that the PWM output of the comparator may be used to drive the power switch 100. Without the contribution of the differentiator's 20 gain and phase shift in high frequency, the behavior of the closed loop system is highly unpredictable. The differentiator 20 can be implemented by any of a number of different linear electronic circuits known to those skilled in the art.

FIG. 6A illustrates an example of a first-order differentiator 20. FIGS. 6B and 6C illustrate examples of second-order differentiators 20. The skilled artisan will recognize these differentiators as high-pass filters. A band-pass filter (not shown) can also be used in the differentiator 20, providing the benefit of more predictable oscillation frequency. It will be appreciated, however, that the use of a band-pass filter may have a detrimental effect on transient response or flatness of the distortion as a function of input frequency. Indeed, feedback system theory establishes the transfer function to depend only on the feedback if the loop gain is much higher than unity at interested frequencies. Consequently, for superior high frequency performance, a high-pass filter as differentiator 20 is typically used, especially in embodiments that employ a 2nd order low-pass filter to implement the reconstruction filter L1-C2.

In the examples, the high-pass or band-pass filter of the differentiator 20 in combination with the reconstruction filter L1-C2 essentially determine the switching frequency of the amplifier. For a given reconstruction filter L1-C2, higher switching frequencies can be associated with higher gain and phase shift of the differentiator 20. Typically, the differentiator 20 extracts a saw tooth carrier from the output signal 30. Further, the reconstruction filter L1-C1 has a double pole in its transfer function while the differentiator 20 has a zero and a combined transfer function has a pole or simple integration. Thus, integration of the rectangular waveform of the power switch 100 can yield a saw tooth signal. This saw tooth signal may be advantageously used to generate a PWM signal by means of the comparator U2. According to some aspects of the present invention, the provision of a high-frequency path to process the carrier of the PWM signal rather independently of the audio signal gives good control of the switching frequency. The switching frequently is preferably maintained at high enough levels, such as from 100 kHz to 1 Mhz, for good audio performance, yet not too high to keep switching losses reasonable. Each transition of the comparator U2 corresponds to the moment when the difference between the audio input signal 10 and the audio output signal 30 is zero. Thus this control technique results in an audio output signal 30 proportional to the audio input signal 10.

To further reduce harmonic distortions, a resistor R6 can be inserted in series with the integrating capacitor C2 to introduce a zero in the Laplace transfer function of the error amplifier U1. In certain embodiments, the weighed summing of different signals such as the integrated error voltage Vi and the differentiated output voltage Vd is performed by choosing appropriate weighing resistors or impedances R2–R3 and not by a summing operational amplifier. It will be appreciated that this approach represents a significant departure from prior art control systems which yield lower performance. In return for more complicated mathematics, the direct summing approach can eliminate all imperfections found in typical operational amplifiers such as limited gain-bandwidth product and unpredictable phase shift, while also eliminating any possible causes of distortion of a summing operational amplifier itself.

In a further improved embodiment, a switching node of the power switch 100 can also be applied to the error integrator U1 via RCR network R4-C3-R5. The RCR network R4-C3-R5 has a relatively small capacitor C3 acting as a low-pass filter such that the rise and fall times of the power switch 100 are slightly increased, thereby reducing the demand on the integrating error amplifier U1. A feedback signal through the RCR network R4-C3-R5 is faster than the feedback through the speaker LS1 terminals which often must go through a difference amplifier which again may have its own limited slew rate and corresponding delays, in addition to its usual distortion. The feedback through the RCR network R4-C3-R5 allows the designer to cause the controlled oscillation to oscillate at an even higher frequency for even higher bandwidth enabling higher audio performance. Experimental results have shown that even though few human ears can hear sine waves above about 20 kHz, higher harmonics and bandwidth can contribute to audible higher sound reproduction quality which may involve spatial or timing information and not just frequency information.

When audio output 30 voltage approaches that of the supply voltage VCC+ or VCC−, the nature of hysteretic control will cause the switching frequency to become lower, mainly due to the need for high duty ratio in combination with the finite time it takes for the error signal—the difference between the audio output signal 30 and the audio input signal 10—to change sign given its quasi-sine nature due to the reconstruction filter L1-C2. Audio quality thus could suffer when that situation occurs. In order to maintain a quasi-constant switching frequency in this extreme case, voltage comparators and logic can be used to detect a high-amplitude condition of the audio input signal 10 to operate the power switch 100 in ternary mode so that the resulting switching frequency almost doubles because, as mentioned earlier, the short "off" time is essentially the same. Thus an embodiment of hysteretic control in combination with dynamically adapted switching mode of operation of the power switch 100 provides a novel method of controlling a switching amplifier to achieve high performance operation.

In certain embodiments, the dual-mode method of controlling a switching amplifier is used in conjunction with a class-N topology of switching amplifier which is subject of a pending patent application by the same applicant. A class-N topology eliminates the conversion of the chopped source voltage back to DC of a typical DC-DC power supply but necessitates the use of ternary switching of the power switch 100. The previously described dynamic mode switching between binary and ternary switching may be adapted for use in a class-N topology of amplifier. Such use derives from a low power DC power supply voltage 60, FIG. 5, (as used in the low power control section supply power to the power switch 100) when the audio input signal 10 is low in instantaneous amplitude, and then by having a pulsing voltage 70 of a class-N modulator supply the high power when the amplitude of the audio input signal 10 is high. Thus, not only high audio performance is possible, the lower cost and higher efficiency of class-N topologies of amplifiers can be used to make better and lower cost switching amplifiers.

This novel combination of dual-mode hysteretic control and a class-N topology yields outstanding results. It offers the best features of switching amplifiers namely the absence of crossover distortion and power waste, the lower cost higher efficiency of class-N amplifiers, and the high audio performance of hysteretic control, which is also enhanced by dynamic dual-mode switching control.

Figure 5:
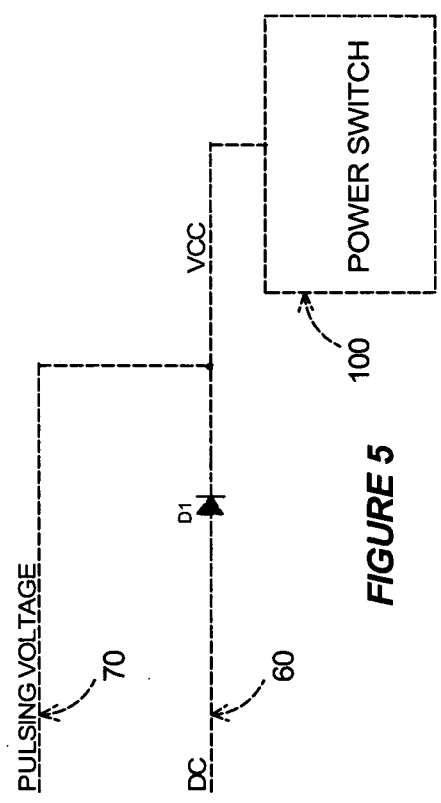
FIG. 5 illustrates a schematic diagram for combining a pulsing supply voltage with a DC supply voltage.
Figure 7:
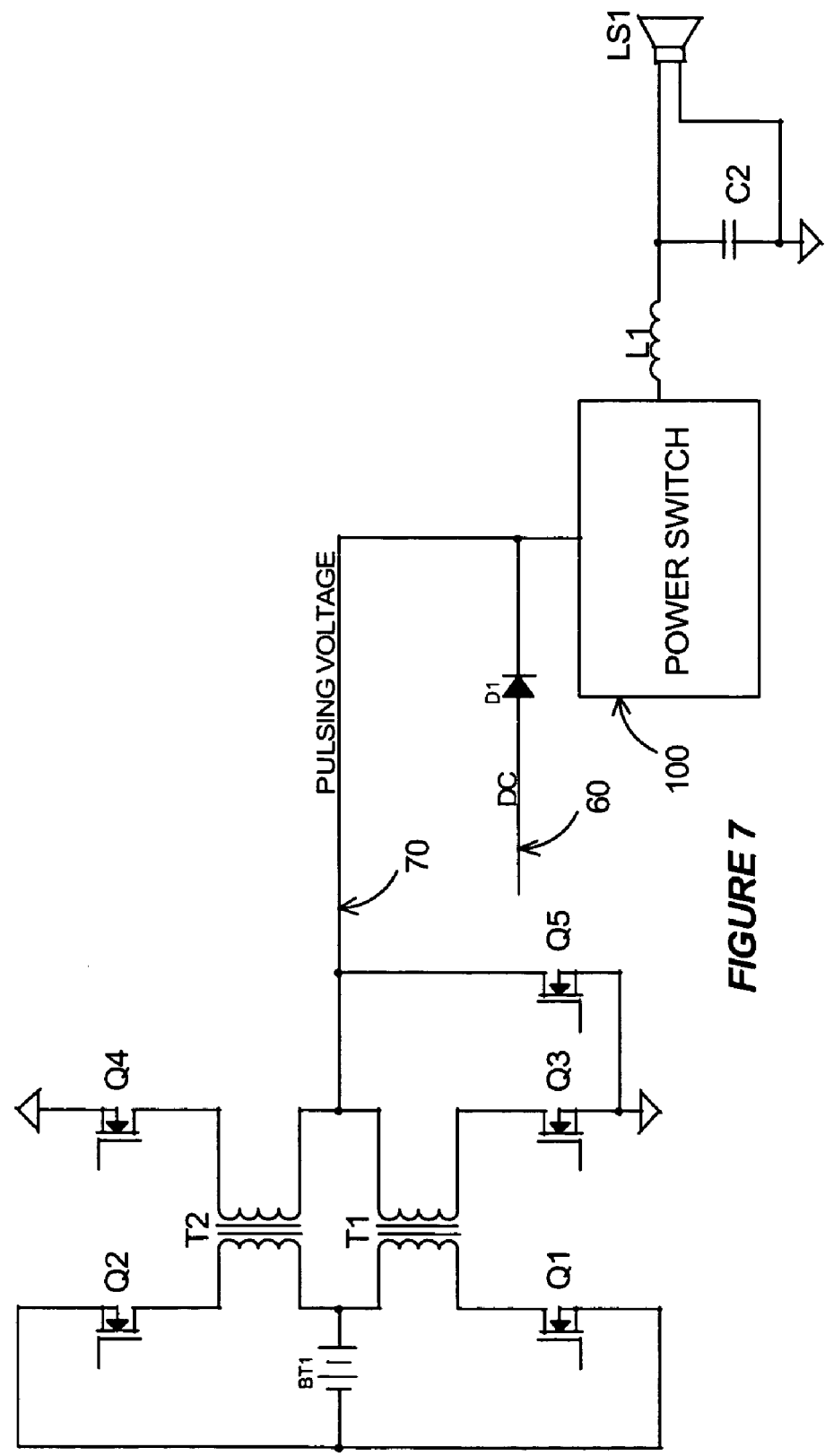
FIG. 7 illustrates another schematic diagram for combining a transformer-supplied pulsing supply voltage with a DC supply voltage.

In certain embodiments of the present invention, because the control loop covers the reconstruction filter and can operate in ternary mode, a self-oscillating amplifier can be provided as an extension of the concept of using a pulsing supply voltage, FIG. 5. The pulsing supply voltage 70 can be asynchronous with the switching of the power switch and thus can be provided by coupling via bi-directional switches of a predetermined number of voltage sources, including voltages from transformers driven by high-frequency switches. FIG. 7 illustrates an example of such an embodiment with two transformers T1–T2 each driven by a MOSFET Q1/Q2 in the primary side, and the current-bidirectional MOSFETs Q3–Q5 controlled to supply a pulsing voltage 70 from the secondary voltages of the transformers T1–T2. In this topology, called double forward topology, the MOSFETs Q1, Q3 are synchronous, as are Q2, Q4 and the MOSFET Q5 is turned on whenever both Q3 and Q4 are turned off, to provide continuity for the current in the reconstruction filter L1-C2. Indeed, the inductive nature of loudspeaker LS1 can result in the speaker's voltage and current being out of phase. Therefore, the current flow in the MOSFETs Q3–Q4 and transformer T1–T2 can be bi-directional. The switching frequencies of the MOSFETs Q1–Q5 can be a fraction of the switching frequencies of the power switch 100, and asynchronous with it. The asynchronous switching of the MOSFET Q1–Q5 relative to the power switch 100 may result in absence of high-speed couplers such as opto-couplers or transformers for controlling especially the switching of MOSFET Q1–Q2 from the secondary side of the transformers T1–T2, resulting in substantial savings in cost and space. The power switch 100 in this case can be an H-bridge which is often used in class-D amplifiers. In certain embodiments of the present invention, however, the H-bridge typically operates in mixed mode binary/ternary from a pulsing voltage 70 and not from a constant DC voltage. The power switch 100 is typically controlled to force the error voltage—the difference between the output signal and the input signal—to zero twice every switching period are previously described.

Figure 8A:
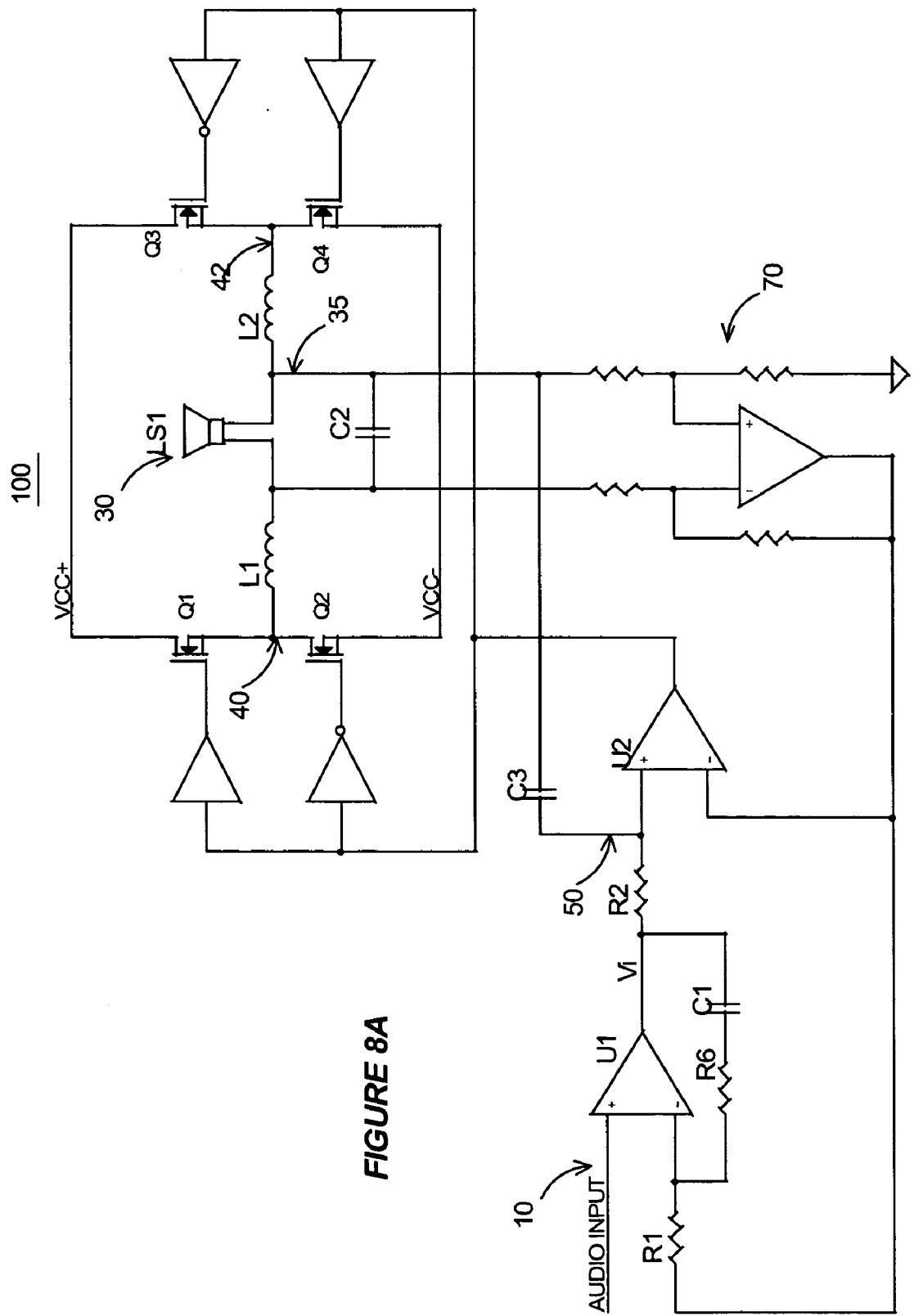
FIGS. 8A–8B illustrate a bridged switching amplifier with a very direct path to maintain self-oscillation at high frequency.

In certain embodiments of the present invention, as shown in FIG. 8A, the power switch 100 is implemented with an H-bridge operating in binary mode, where two switching nodes 40–42 transition in opposite directions. In addition to much higher power capability when compared to a half-bridge power switch, this configuration makes possible a very direct high frequency path via a capacitor C2 as differentiator with correct polarity from a speaker terminal 35 to the sum voltage 50. Such a direct path from a speaker terminal 35, whose voltage already has the carrier frequency greatly filtered out by the reconstruction filter L1-L2-C2, therefore is a relatively low frequency signal and not a square wave. The direct path typically does not cause noisy interference to neighboring printed circuit wires, as is typical when the feedback voltage is received from a switching node 40 and has zero propagation delay, thereby making possible a higher switching frequency as desired.

Figure 8B:
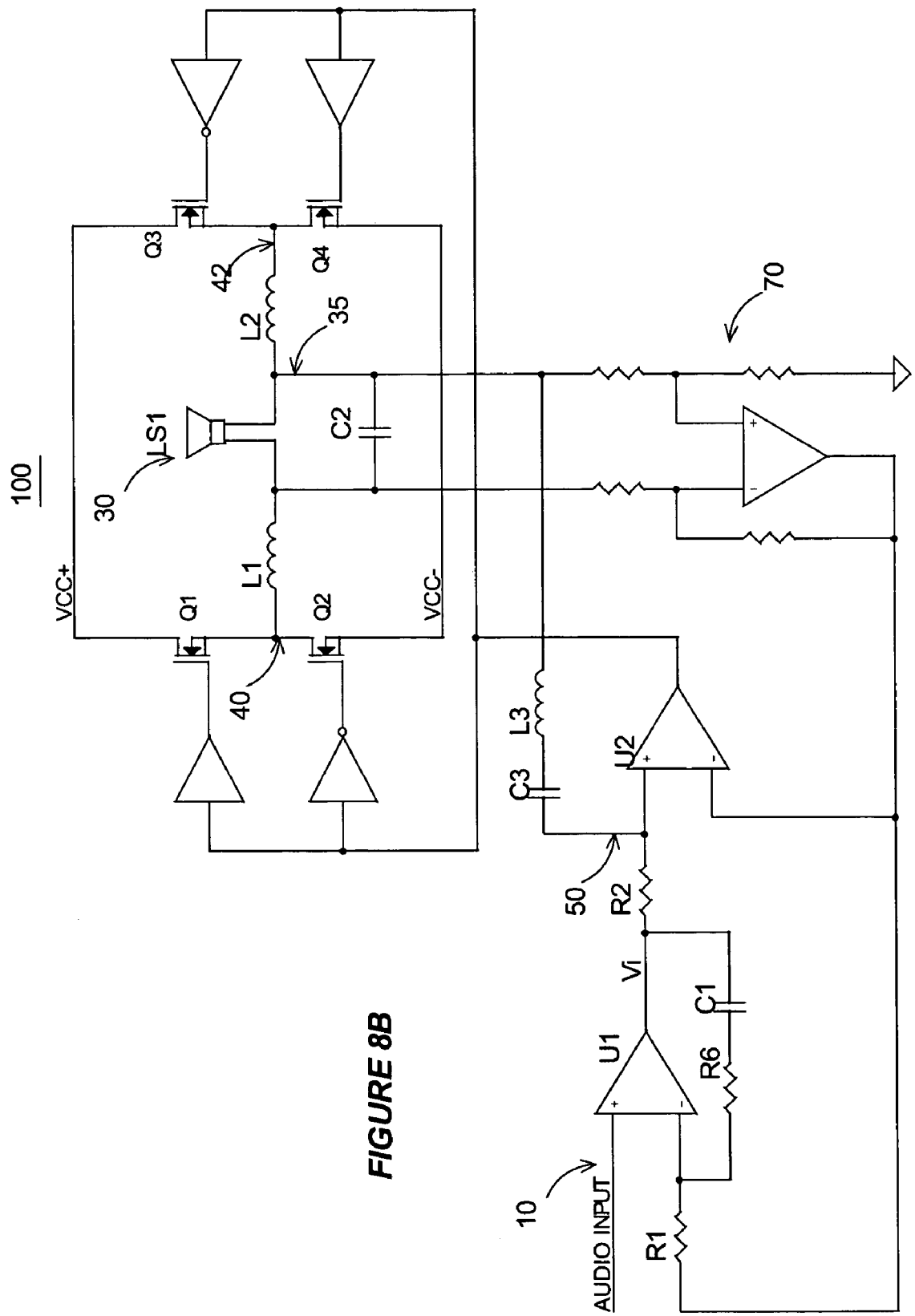

A useful variation of the embodiment of FIG. 8A is illustrated in the example depicted in FIG. 8B, where an LC resonance circuit L3-C3 is used for its high quality factor Q to keep the self-oscillating frequency of the switching amplifier predictable within a narrow range. By judicious selection of the capacitance of the capacitor C3 and the inductance of the inductor L3, the quality factor Q of the oscillator sub-circuit of the self-oscillating switching amplifier can be properly designed by the skilled in the art. Another advantage of this embodiment over the previous one is that the LC resonance circuit L3-C3 also filters out all high frequency spikes that the reconstruction filter L1-L2-C2 does not totally eliminate due to parasitic capacitances of practical inductors. Thus the oscillator signal is more noise-free, leading to lower noise and distortion of the switching amplifier of the present invention.

Figure 9A:
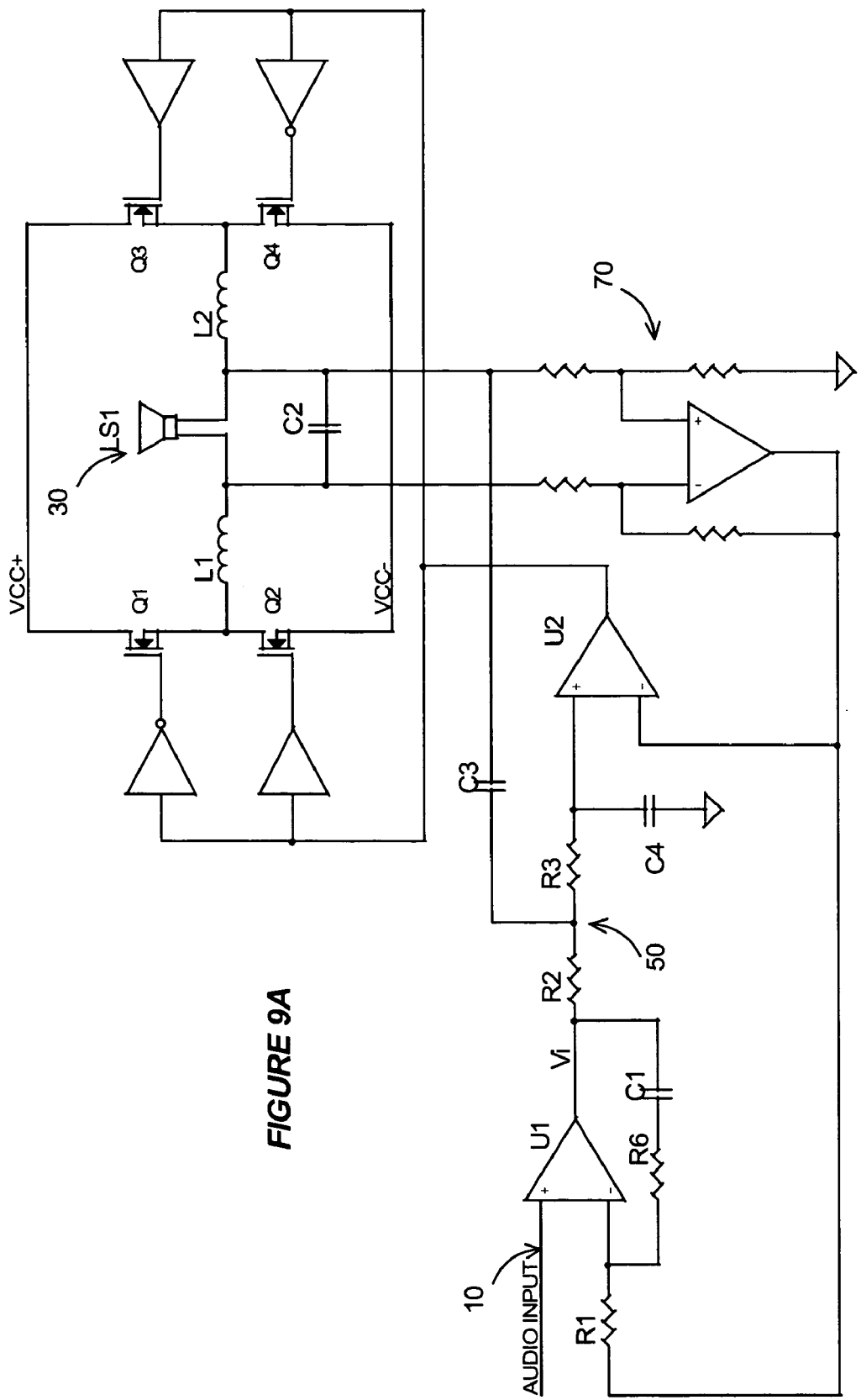
FIGS. 9A and 9B illustrate a further improvement of the bridged switching amplifier of FIGS. 8A–8B.
Figure 9B:
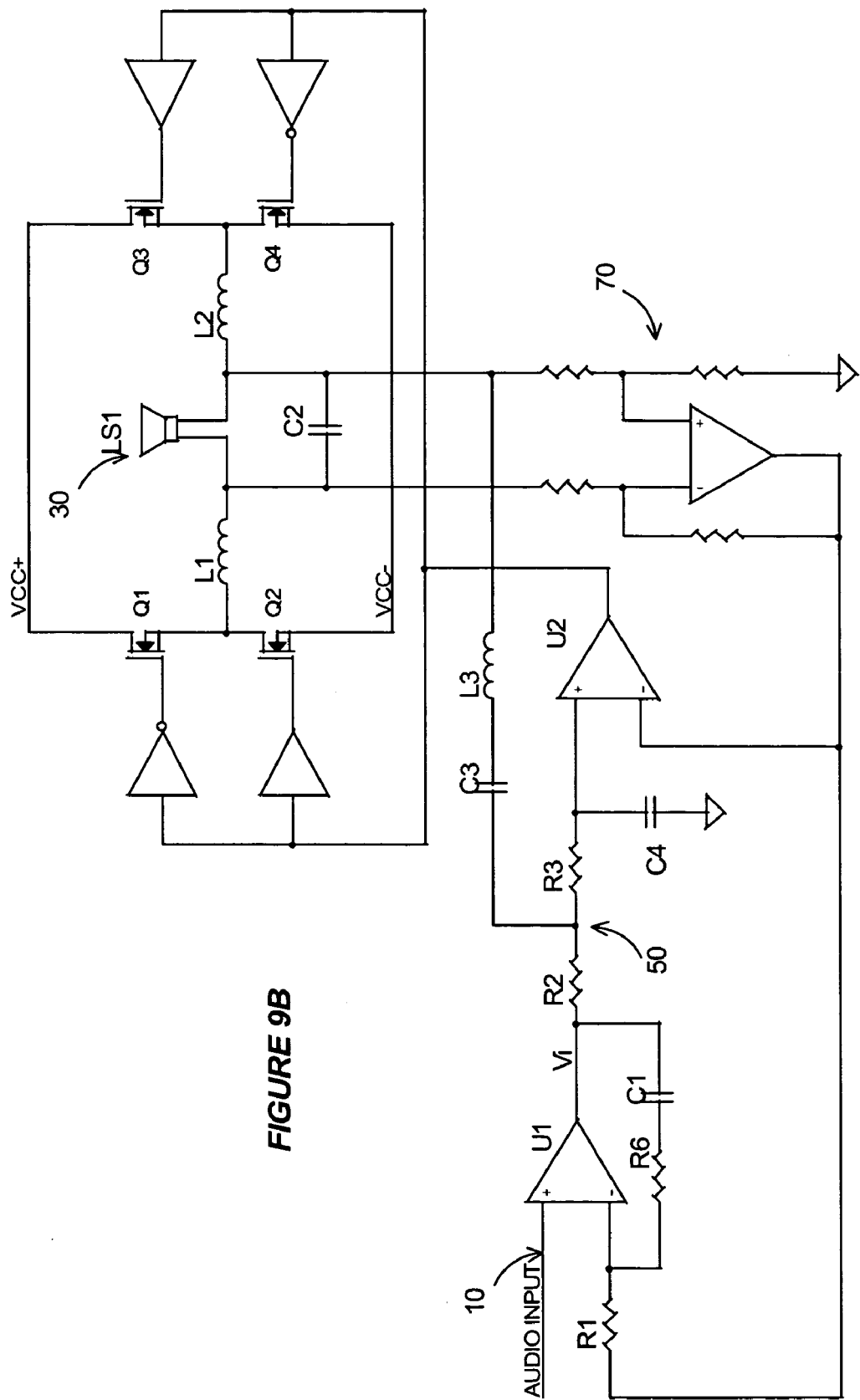
Figure 9C:
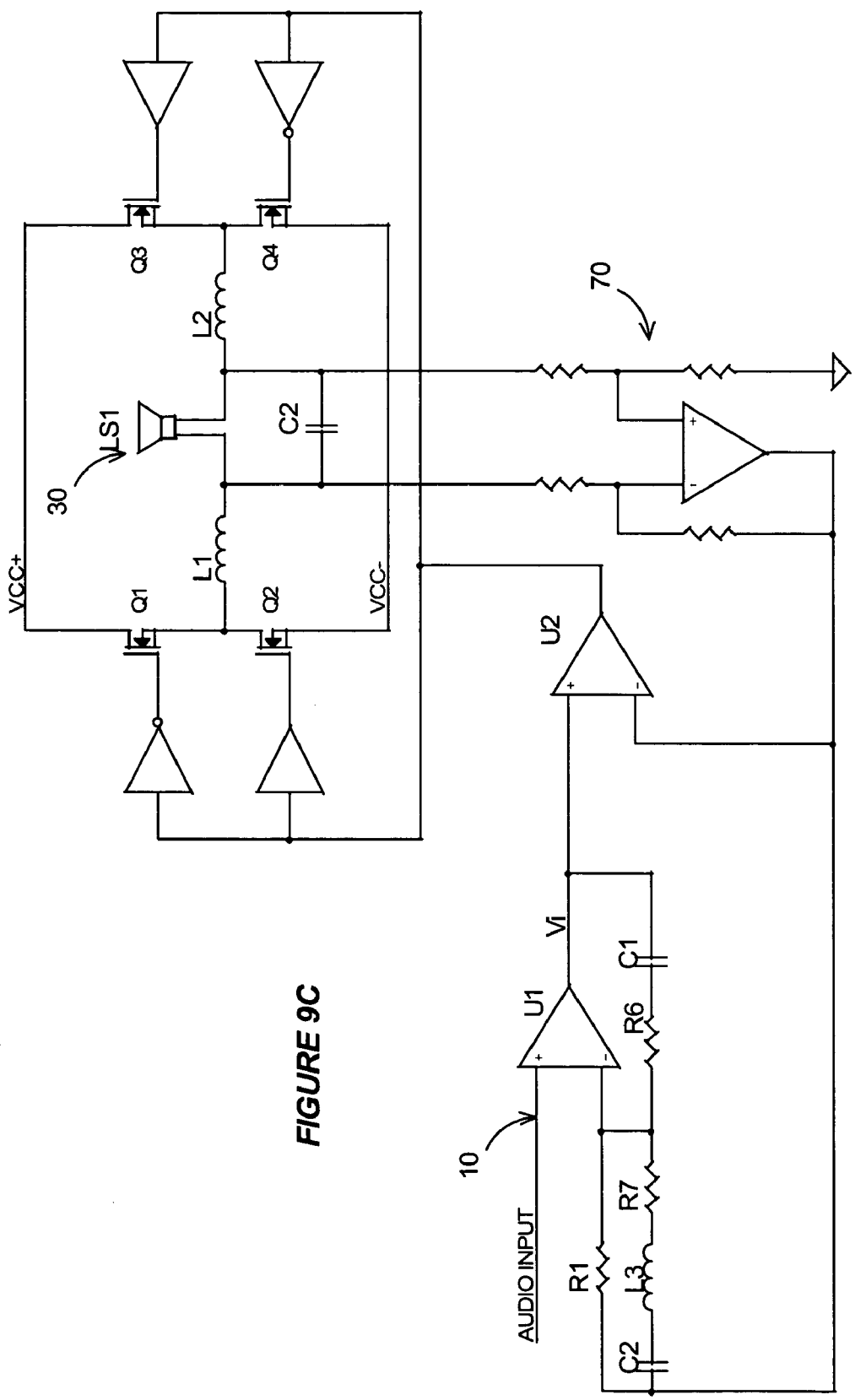
FIG. 9C illustrates an example of a bridged switching amplifier wherein an LCR circuit is in parallel with the feedback resistor for maintaining a predetermined switching frequency.

Certain potential improvements to the circuits of FIGS. 8A–8B are illustrated in FIGS. 9A–9B. In the example shown in FIG. 9A an RC filter R3-C4 is inserted in the signal path from the sum voltage 50 to the comparator U2 for additional filtering of any high frequency noise and for controlling the oscillation frequency. A further variation is illustrated in the example depicted in FIG. 9C where the LCR components L3-C3-R7 for maintaining oscillation are now at the input of the error amplifier U1, in parallel with the resistor R1. In principle, this embodiment typically would not switch at as high a frequency as the embodiment of FIG. 9B, due to the finite speed of the difference amplifier 70 and of the error amplifier U1, and to some extent due to a lower quality factor of such a LCR circuit L3-C3-R7, not only to due to the presence of the series resistor R7, but also due to the parallel resistor R1, both of them contribute to lowering the quality factor of a resonance circuit.

Figure 10A:
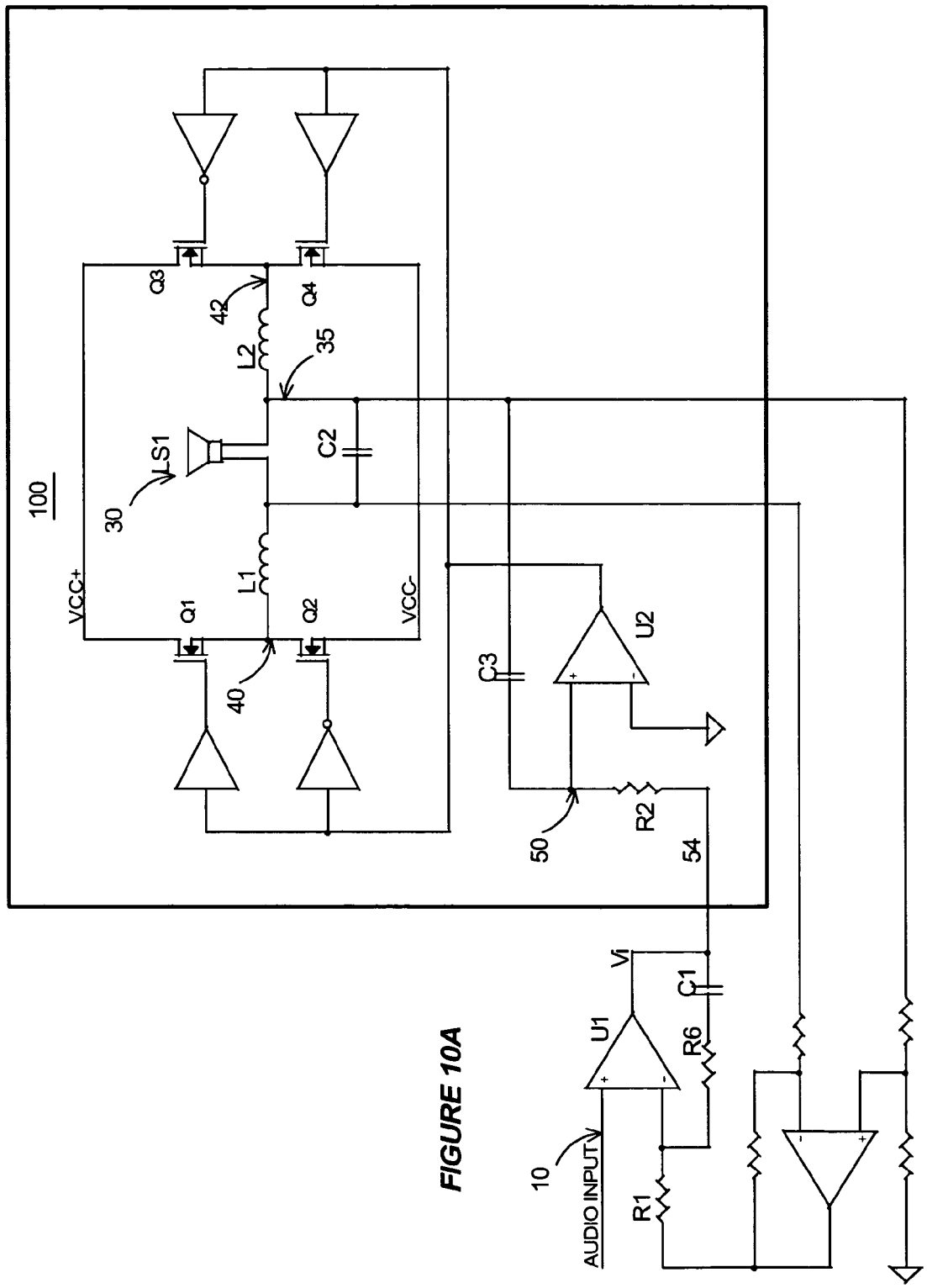
FIGS. 10A to 10C illustrate other conceptual views and variations of embodiments illustrated in FIGS. 8A and 2A–2B.
Figure 10B:
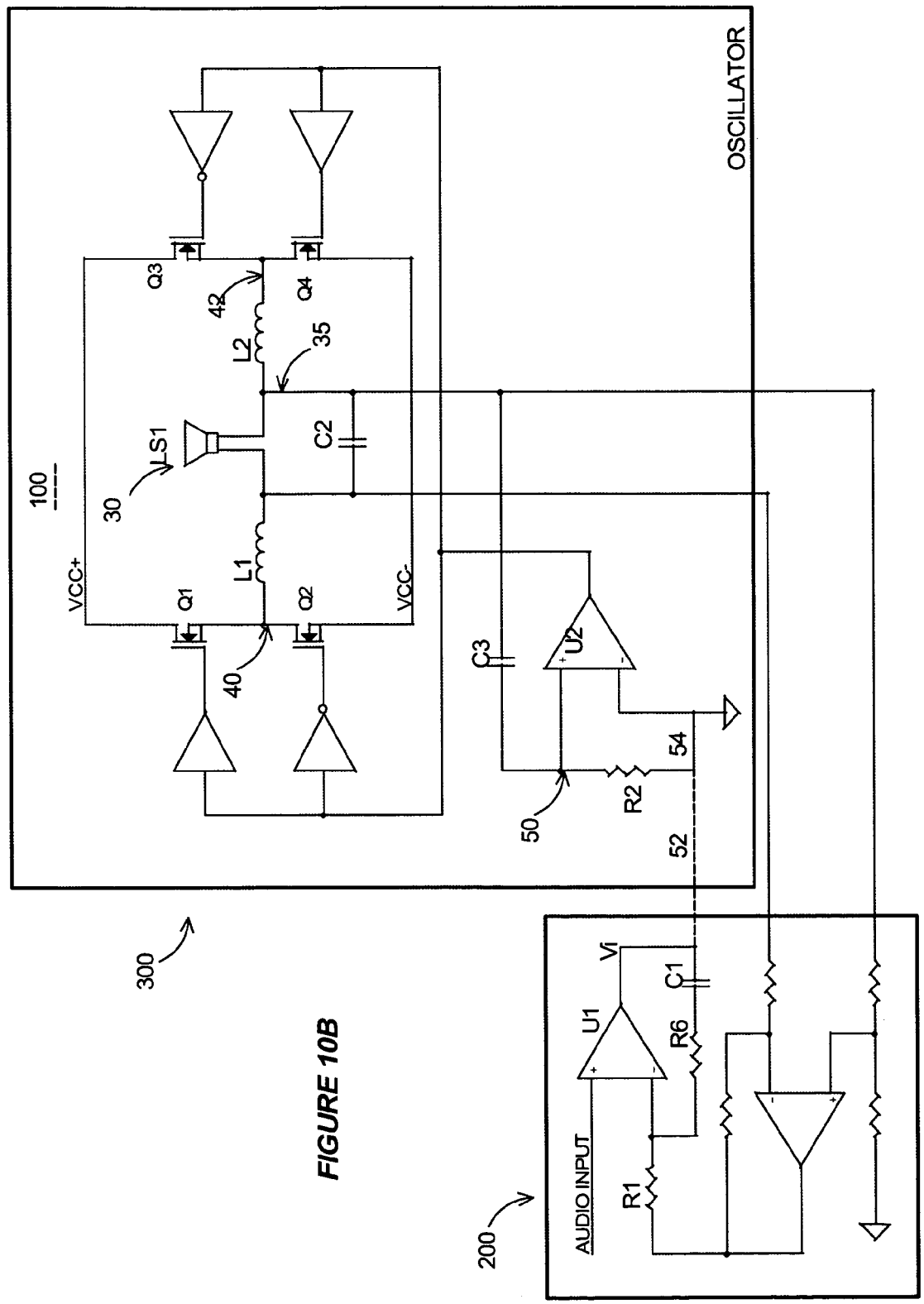

In another variation, illustrated in the example depicted in FIG. 10A, the negative input 56 of the comparator U2 is simply grounded. Indeed, regardless of the connection of the negative input 56 of the comparator U2, the error amplifier U1 can put out an error signal Vi such that the output signal 30 follows the audio input signal 10. However, the example of FIG. 10A includes a functional block 300 that may be characterized as an oscillator when the free end 54 of the resistor R2 is grounded for necessary biasing of the feedback path of the oscillator 300 via the capacitor C3 or another suitable feedback element—regardless of whether it's an impedance or a network of many electronic components. The switching amplifier depicted in the example of FIG. 10B comprises a free-running oscillator 300 provides pulse widths that are modulated by a voltage which is the output voltage Vi of the error amplifier U1, by simply feeding that modulating voltage Vi to the oscillator 300 via the path 52 to the biasing resistor R2, which is no longer connected to ground via the path 54. It can be appreciated that the invented self-oscillating amplifier may have very high bandwidth and can be very stable if not unconditionally stable, because its associated oscillator 300 already oscillates at its own oscillation frequency and therefore does not oscillate at another frequency at the same time. Thus the LC reconstruction filter L1-L2-C2 that limits the bandwidth and performance of prior art switching amplifiers due to its 180-degree phase shift may now not only participate as a necessary component of an oscillator 300 but it also frees the audio switching amplifier of the present invention from loop instability and limited bandwidth. With high signal bandwidth approaching a third of the switching frequency of the oscillator 300, comes high audio performance when high gain high bandwidth operational amplifiers or circuits are used to implement the error amplifier U1.

Experimental results have shown bandwidths over 200 kHz are now possible with an oscillator 300 switching frequency of around 500 kHz. A natural consequence of high unity-gain frequency of the signal feedback loop is very high gain at audio frequencies therefore very low distortion of the amplifier. It is obvious to the skilled in the art that there are many possible embodiments for oscillators, from relaxation oscillators to linear oscillators where a total phase shift of 360 degrees at unity loop gain maintains the oscillation. The control scheme presented in this invention is much different from prior art hysteretic controllers in many aspects, one of which is the absence of the two thresholds to which the output voltage is compared to determine the next transition of the power switch 100. The oscillator 300 will certainly oscillate because the voltage at the speaker terminal 35 is phase-shifted 180 degrees relative to the voltage at the switching node 42 due to the reconstruction filter's L1-L2-C2 low corner frequency compared to the switching frequency. Relative to the positive input 50 of the comparator U2, the switching node 42 has 180-degree phase shift. Thus when the voltage at the speaker terminal 35 is fed to the positive input 50 of the comparator U2 it closes the loop with a total of 360 degrees phase shift, assuring a natural oscillation.

Figure 10C:
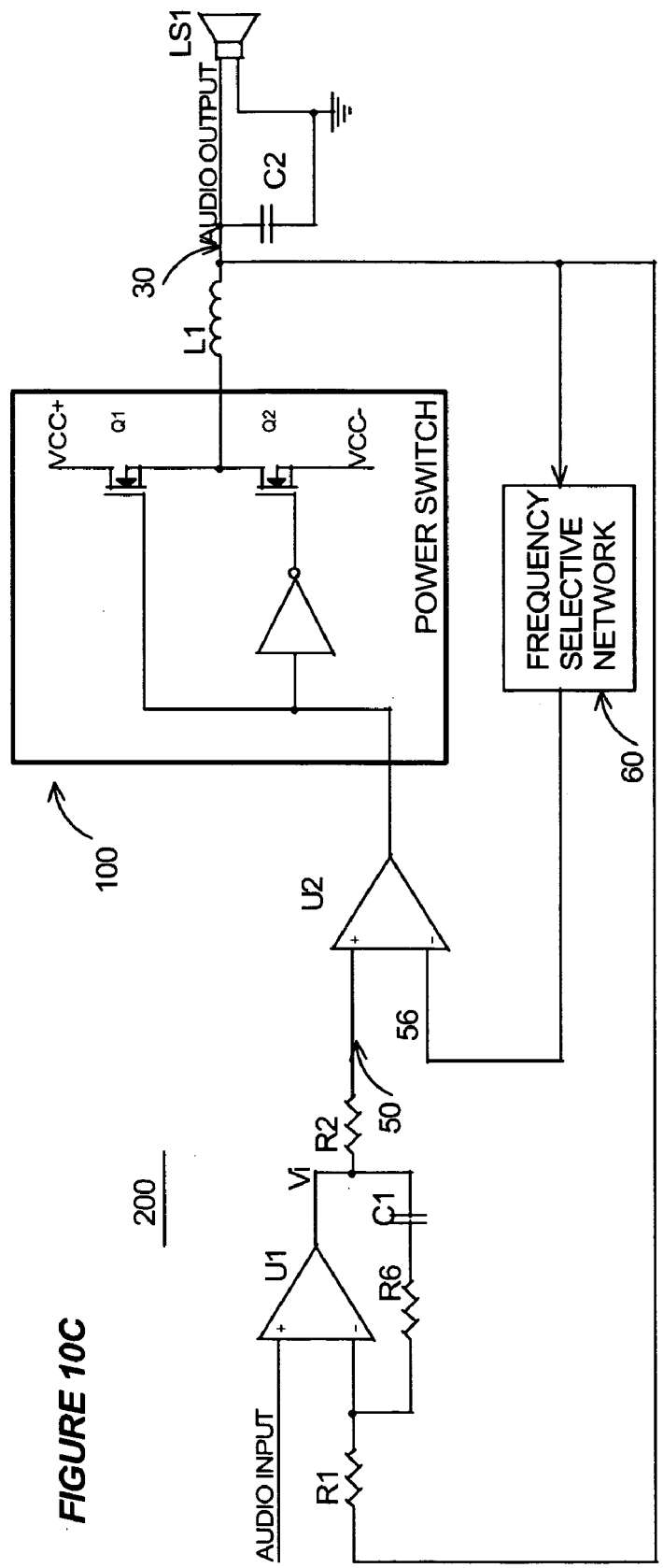

Referring to FIG. 10C, when the configuration of the power switch 100 is single-ended, a total phase shift of 360 degrees can be obtained by coupling via an appropriate frequency-selective network 60 the amplifier's output node 30 to the negative input 56 of the comparator U2 so that natural oscillation is assured. Thus the switching amplifier illustrated in FIG. 10C is just one possible variation of the one illustrated in FIGS. 2A–2B.

Figure 11A:
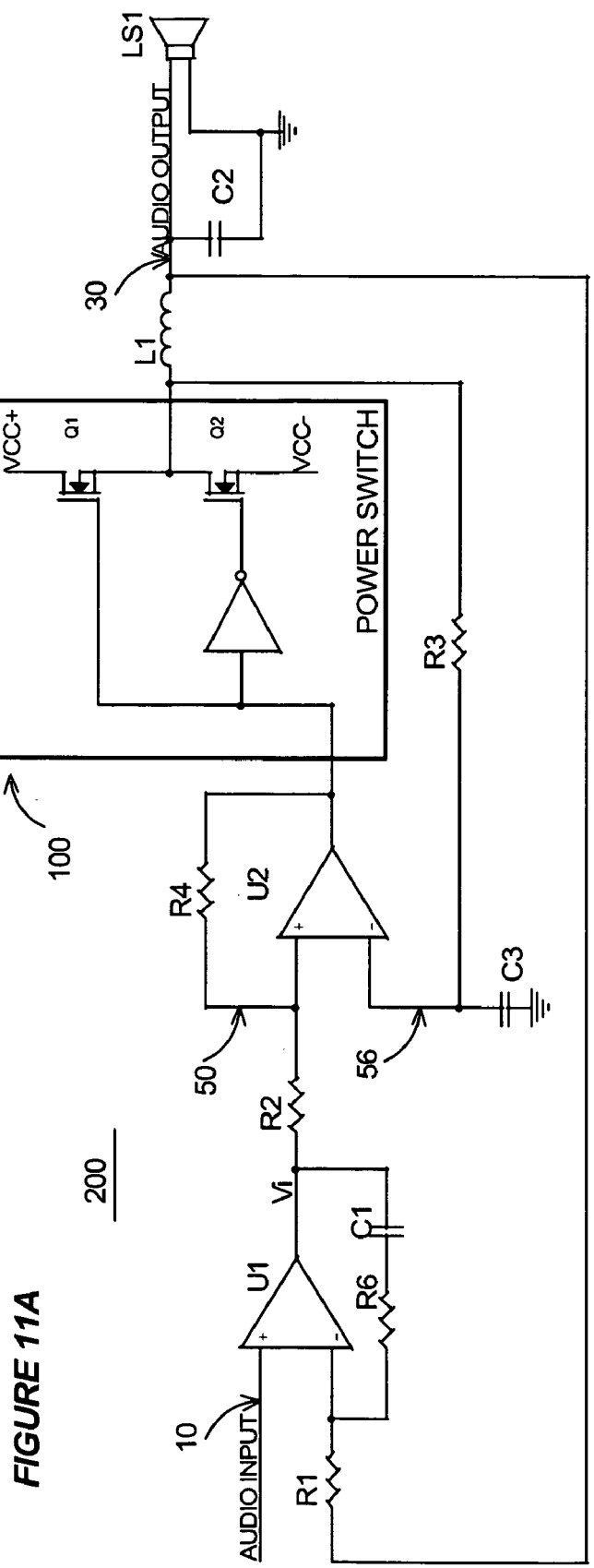
FIG. 11A illustrates a self-oscillating switching amplifier making use of a relaxation oscillator and an error amplifier.

A relaxation oscillator can also be used in a self-oscillating switching amplifier as illustrated in the example depicted in FIG. 11A, where the network R3-C3 provides the necessary delay in conjunction with the resistors R2–R4 that supply a hysteresis to the comparator U2. Those skilled in the art will appreciate that appropriate values of R2-R3-R4-C3 can make the relaxation oscillator operate at a desired oscillation frequency. Similar to the example shown in FIG. 10C, the error amplifier U1 can modulate the pulse width of the relaxation oscillator formed by the power switch 100, the comparator U2, and the delay network comprising R2-R3-R4-C3. The power switch can also be an H-bridge as previously discussed and illustrated in FIG. 10A.

From the description above, a number of advantages of the invented self-oscillating switching amplifiers become evident:

(a) The average of the error between the audio input and audio output signals for each switching period is zero for low harmonic distortion at the output.

(b) The absence of any triangular oscillator, which is a source of distortion and noise due to its frequency and amplitude jitter, results in a simpler and lower cost circuit.

(c) The multiple feedback paths covering the reconstruction filter also minimize distortion.

(d) The control loop has both very high gain and very high bandwidth for low distortion, even at high frequencies.

(e) The output impedance of the amplifier is extremely low due to feedback being taken directly from speaker terminals.

(f) Switching mode changing leads to further distortion reduction, higher efficiency, and to the possibility of using a class-N topology.

Accordingly the reader can see that self-oscillating switching amplifiers provided by the present invention embodies many novel circuits all in the direction of higher bandwidth and lower distortion while keeping component count to a minimum. Amplifiers are rather generic in terms of electronic circuit. They are fundamental building blocks of most analog electronic systems including servo control, inverter, motor drive, power supply voltage regulation, etc. The self-oscillating switching amplifier of the present invention can be used with minimum adaptation as a DC-to-AC converter, also called inverter, as a DC-to-DC converter, a switch-mode power supply (SMPS), a ultrasound generator—due to its high bandwidth in excess of 200 kHz in many configurations, variable frequency motor drive, etc.

Although the present invention has been particularly described with reference to embodiments thereof, it should be readily apparent to those of ordinary skill in the art that changes and modifications in the form and details thereof may be made without departing from the spirit and scope of the invention. For example, those skilled in the art will understand that variations can be made in the number and arrangement of components illustrated in the above block diagrams. It is intended that the appended claims include such changes and modifications.

What is claimed is:

1. A self-oscillating switching amplifier, the amplifier comprising:
   a power switch providing a high-power output signal,
   an error amplifier providing an error voltage representative of differences between an input signal and the high-power output signal,
   an output differentiator for receiving a feedback signal representative of the output voltage and generating a differentiated signal representative of high frequency gain and phase shift in the high-power output signal;
   a pulse width modulation ("PWM") signal generator for providing a PWM signal representative of a linear combination of the error voltage with the differentiated signal, and
   a reconstruction filter for receiving the high-power output signal and providing a reconstructed output signal.

2. The self-oscillating switching amplifier of claim 1 wherein the output differentiator includes a low-frequency blocking filter.

3. The self-oscillating switching amplifier of claim 1, wherein the feedback signal is provided by a feedback circuit configured to cause the high-power signal to oscillate.

4. The self-oscillating switching amplifier of claim 3 wherein the feedback circuit includes a resonance circuit.

5. The self-oscillating switching amplifier of claim 3 wherein the feedback circuit includes a low-pass filter for controlling the switching frequency of the high-power signal.

6. The self-oscillating switching amplifier of claim 1 wherein the power switch has one or more modes of operation including a binary mode and a ternary mode, and wherein a current mode of operation is selected based on the amplitude of the input signal.

7. The self-oscillating switching amplifier of claim 6 wherein the power switch is coupled to a DC voltage when the binary mode is selected, and coupled to a pulsing supply voltage when the ternary mode is selected.

8. A method for controlling a self-oscillating switching amplifier, the self-oscillating switching amplifier receiving an input signal and providing an output signal, comprising the steps of:
   amplifying and integrating the difference between the input signal and the output signal to obtain an integrated error signal;
   differentiating the output signal to obtain a differentiated signal;
   linearly summing with predetermined weighting factors the integrated error signal with the differentiated signal to obtain a sum signal;
   comparing the sum signal with a predetermined voltage to obtain a PWM signal, wherein the PWM signal controls an output of a power switch; and
   sensing an output of a reconstruction filter to provide a feedback signal to the error amplifier and the differentiator, wherein the reconstruction filter receives the output of the power switch.

9. The method of claim 8, wherein the output of the reconstruction filter is coupled to the output signal.

10. The method of claim 8 wherein the step of differentiating is implemented using a differentiator comprising a resonance circuit with a predetermined quality factor for maintaining the self-oscillation frequency in a narrow frequency range.

11. The method of claim 8, and further comprising selecting a mode of operation of the self-oscillating amplifier, wherein the mode is one of a plurality of modes including a binary mode and a ternary mode, and wherein mode selection is based on instantaneous amplitude of the audio input signal.

12. A method for controlling the high frequency switching of a self-oscillating switching amplifier having a power switch, a reconstruction filter, an input signal and an output signal, the method comprising the steps of amplifying and integrating the difference between the input signal and the output signal with an error amplifier to obtain an error signal; extracting a carrier frequency from the output signal with a frequency-selective filter; combining the error signal with the carrier frequency via predetermined impedances to obtain a sum voltage; comparing the sum voltage with a predetermined voltage to obtain a PWM signal to drive the power switch; wherein the frequency-selective filter in combination with the reconstruction filter determine the switching frequency of the amplifier.

13. The method of claim 12 wherein the output signal is combined with the error signal via a resonance circuit and a resistor, resulting in a sum signal having a high frequency carrier of small amplitude, that when compared to a predetermined voltage, generates the PWM signal.

14. The method of claim 12 which further comprises the step of injecting via a linear network a switching voltage of the power switch to the error integrator.

15. A self-oscillating switching amplifier amplifying an input signal into a high power output signal driving a load via its two output terminals, the amplifier comprising:
   an oscillator comprising a power switch, a comparator, and a feedback signal taken from an output terminal and coupled to an input of the comparator via a frequency-selective network for producing a natural oscillation,
   an error amplifier for amplifying the difference between the output signal and the input signal to produce an error voltage, which is in turn fed to the comparator of the oscillator to modulate the pulse width of the oscillation pulses,
   wherein the oscillator known to oscillate consistently also forms with the error amplifier a self-oscillating switching amplifier capable of very low distortion, very high bandwidth and very high efficiency, and wherein the frequency-selective network is a resonance circuit.

* * * * *